United States Patent
Ozimek et al.

(10) Patent No.: US 9,368,328 B2
(45) Date of Patent: Jun. 14, 2016

(54) APPARATUS FOR GENERATING AND MAINTAINING PLASMA FOR PLASMA PROCESSING

(71) Applicant: TRUMPF Huettinger Sp. z.o.o., Zielonka (PL)

(72) Inventors: Pawel Ozimek, Warsaw (PL); Andrzej Klimczak, Warsaw (PL); Marcin Zelechowski, Warsaw (PL); Marcin Golan, Warsaw (PL)

(73) Assignee: TRUMPF Huettinger Sp. z o. o., Zielonka (PL)

( * ) Notice: Subject to any disclaimer, the term of this patent is extended or adjusted under 35 U.S.C. 154(b) by 0 days.

(21) Appl. No.: 14/417,214

(22) PCT Filed: Jul. 24, 2013

(86) PCT No.: PCT/EP2013/065613
§ 371 (c)(1),
(2) Date: Jan. 26, 2015

(87) PCT Pub. No.: WO2014/016335
PCT Pub. Date: Jan. 30, 2014

(65) Prior Publication Data
US 2015/0206711 A1    Jul. 23, 2015

Related U.S. Application Data

(60) Provisional application No. 61/676,825, filed on Jul. 27, 2012.

(51) Int. Cl.
*H01J 7/24* (2006.01)
*H01J 37/32* (2006.01)

(52) U.S. Cl.
CPC ............ *H01J 37/3211* (2013.01); *H01J 37/321* (2013.01); *H01J 37/32174* (2013.01)

(58) Field of Classification Search
CPC .................................... H01J 7/24; H01J 37/32
USPC ............. 315/111, 21, 111.41, 111.51, 111.71
See application file for complete search history.

(56) References Cited

U.S. PATENT DOCUMENTS

| 5,909,086 | A | * | 6/1999 | Kim | ................. | H01J 37/32009 |
| | | | | | | 315/111.21 |
| 5,998,933 | A | | 12/1999 | Shun ko | | |
| 6,432,260 | B1 | * | 8/2002 | Mahoney | ............ | H01J 37/321 |
| | | | | | | 118/723 AN |

(Continued)

FOREIGN PATENT DOCUMENTS

WO    WO2010098779 A1    9/2010

OTHER PUBLICATIONS

International Preliminary Report on Patentability for corresponding PCT Application No. PCT/EP2013/065613, mailed Jan. 27, 2015, 7 pages.

(Continued)

*Primary Examiner* — Tung X Le
(74) *Attorney, Agent, or Firm* — Fish & Richardson P.C.

(57) ABSTRACT

An apparatus for generating and maintaining plasma for plasma processing using inductively coupled RF power. The apparatus includes a resonant circuit having a resonant capacitance and a resonant inductance, an excitation circuit for exciting the resonant circuit, and a coupling element for coupling RF power from the inductance into a plasma chamber.

19 Claims, 12 Drawing Sheets

(56) References Cited

U.S. PATENT DOCUMENTS

| | | | |
|---|---|---|---|
| 6,822,396 B2 * | 11/2004 | Gonzalez | H01J 37/32009 118/723 IR |
| 2002/0060523 A1 * | 5/2002 | Bhardwaj | H05H 1/46 315/111.21 |
| 2002/0130110 A1 | 9/2002 | Kim et al. | |
| 2003/0146803 A1 * | 8/2003 | Pickard | H03H 7/38 333/32 |
| 2007/0103092 A1 * | 5/2007 | Millner | H01J 37/321 315/276 |
| 2010/0219757 A1 * | 9/2010 | Benzerrouk | H01J 37/321 315/111.51 |

OTHER PUBLICATIONS

International Search Report from corresponding PCT Application No. PCT/EP2013/065613, mailed Sep. 26, 2013, 3 pages.

* cited by examiner

APPARATUS FOR GENERATING AND MAINTAINING PLASMA FOR PLASMA PROCESSING

This invention relates to an apparatus for generating and maintaining a plasma for plasma processing using inductively coupled RF power.

Numerous forms of inductively coupled plasma sources have been described along with their applications to material processing. These devices make use of at least one induction coil element disposed in close proximity to, around or within a vacuum chamber that is excited with RF power. Electromagnetic fields about the induction coils sustain a gas plasma discharge within a plasma chamber.

RF plasma is extensively used in a wide variety of applications for carrying out process operations. For example, plasmas can be used to promote chemical reactions. During the manufacture of semiconductor devices, etch processes involving RF plasmas and deposition processes involving RF plasmas are used repeatedly during the fabrication process. RF plasmas are also used in cleaning processes in manufacture of semiconductor devices. Plasmas can be used to strip photo resist materials from semiconductor wafers as part of post-etch wafer clean procedures. Furthermore, RF plasmas have been used for decomposition of chemical compounds that are hazardous or otherwise undesirable.

One frequently encountered problem with standard inductively coupled RF plasma systems is the difficulty of igniting and sustaining the plasma. Plasma ignition is unreliable because coupling an ignition voltage high enough to generate the energetic species needed to produce the plasma is difficult. In standard inductively coupled plasma technology, the absence of strong electric fields and the absence of strong capacitive coupling make it difficult to overcome the plasma ignition problems.

Often, certain ignition circuits are used just for igniting the plasma. Those ignition circuits have to be switched off, once the plasma has been ignited.

Implementations disclosed herein may provide an apparatus that can be used for igniting a plasma in a plasma chamber without having to use specific ignition circuitry. Implementations may also provide a reliable apparatus for creating and sustaining a plasma that can be produced at low cost.

In a first aspect, an apparatus is disclosed for generating and maintaining plasma for plasma processing using inductively coupled RF power, the apparatus including:
 a) a resonant circuit comprising a resonant capacitance and a resonant inductance,
 b) an excitation circuit for exciting the resonant circuit,
 c) a coupling element for coupling RF power from the inductance into a plasma chamber.

The resonant circuit may be a series resonant circuit. The resonant circuit may be floating. This should mean that there is no direct connection from the resonant circuit to ground or earth. All capacities to ground and earth from the resonant circuit may be symmetrical. The resonant circuit may be provided symmetrical to ground. This is an advantage for the excitation circuit. Because the excitation circuit does have difficulties in working, if the load is not symmetrical to the ground earth of the plasma chamber, even if the excitation circuit has no earth connection at the output.

Another aspect relates to an RF plasma power supply system with an excitation circuit and a resonant circuit including a resonant capacitance and a resonant inductance, where at least a part of the resonant inductance is adapted or configured to inductively couple RF power to the plasma chamber via a coupling element, where the resonant circuit is floating.

The resonant circuit may be adapted or configured to be positioned in close proximity to a plasma chamber.

The RF plasma power supply system may be adapted or configured to be positioned in close proximity to a plasma chamber.

The resonant circuit provides a resonant inductance that can be used to sustain plasma, once the plasma has been ignited. The resonant circuit can be excited at resonance frequency prior to igniting the plasma. This leads to a high voltage over the resonant capacitance. This voltage can be used for igniting the plasma in the vacuum chamber. As soon as the plasma is ignited, the resonant circuit can be driven at a frequency other than the resonance frequency, thus providing for a lower voltage at the resonant capacitance. Hence, no separate circuitry has to be used and provided for igniting the plasma in the chamber. No ignition circuitry has to be deactivated after ignition of the plasma. The ignition capacitors can be of a small value. Before ignition there is no current or only a very small current, so full voltage or nearly full from the resonant capacitor is coupled to the chamber walls. After ignition, in respect to the resonant capacitance the low capacitance values of the ignition capacitances naturally limit the current to an insignificant level. As soon as the plasma is ignited, the resonant circuit can be driven at a frequency other than the resonance frequency, related to the shift in the resonance frequency after ignition.

The excitation circuit can be used for exciting the resonant circuit at different frequencies, in particular at the resonance frequencies and at frequencies other than the resonance frequency. Once the plasma has been ignited the resonant circuit may be activated at a frequency higher than the resonant frequency.

In a further aspect, a transformer is provided for coupling the excitation circuit with the series resonant circuit. The transformer is provided in order to adjust the voltage and current ratio: on the secondary side low voltage and high current is desirable for better excitation of the plasma by means of electromagnetic flux. But a second advantage of the use of the transformer is to obtain galvanic separation. It is desirable topic to achieve symmetry on the resonant circuit, so that there is no need for ground connection on the resonant circuit side.

The primary of the transformer can be part of the excitation circuit and the secondary of the transformer can be part of the resonant circuit. The coupling of a transformer, in particular a power transformer, with a resonant circuit may cause high currents in the resonant circuit. This again requires good cooling, good magnetic coupling and short electrical connections. If the inductance of the resonant circuit and at least part of a resonant current conductor are embodied as an electrically conductive cooling pipe, good magnetic coupling, good cooling and short connections can be realized. In particular, the cooling pipe may be a fluid or in particular a water-cooled copper pipe.

According to a further aspect, a resonant circuit conductor may form the secondary of the transformer. A toroidal transformer type may be used. This secondary may be only a conductor passed through the toroid. The secondary conductor may be a fluid cooled tube which also achieves good cooling for the primary side without any winding and the magnetic core of the transformer. In the resonant circuit, the resonant capacitance and the resonant inductance are connected by resonant circuit conductors. Part of such a conductor can be used as the secondary winding of the transformer. Hence, no separate element has to be provided for realizing the secondary winding of the transformer. The resonant circuit conductor can be part of the electrically conductive cooling pipe.

The coupling element maybe a ferrite core element, extending into a plasma chamber and being coupled to the resonant circuit inductance. Hence, the ferrite core can be used for coupling the RF power into the plasma chamber. One or several turns of the resonant inductance may be wound around the ferrite core element in order to provide for good inductive coupling.

The resonant inductance may include two parts, where each part is wound around one end of the ferrite core element at either side of the plasma chamber. Hence, the ferrite core element can extend not only into the plasma chamber but also through the plasma chamber.

The apparatus may include a plasma chamber that includes at least one plate being connected via an ignition capacitance to the resonant circuit. The at least one plate may confine the space in which the plasma is ignited within the plasma chamber. If two opposing plates are provided inside or outside the plasma chamber, a voltage can be applied between the two plates which is sufficient for igniting the plasma. In order to create the voltage over the two plates, the resonant circuit may be driven such that a high voltage is present over the resonant capacitance. If the ignition capacitances are connected on either side of the resonant capacitance to a respective plate, a high voltage also is present over the plates, and thus the plasma can be ignited. As soon as the plasma ignites, there is a conductive connection between the plates. This causes a low voltage over the plates and thus a high current through the resonant capacitance. In this case, the ignition capacitances and the resonant capacitance are in parallel. If the ignition capacitances have much lower capacity values than the resonance capacities only low current flows through the ignition capacitance and hence the ignition capacitances will not influence the plasma. Therefore, the ignition capacitances do not have to be deactivated after the plasma has been ignited.

In the plasma chamber, a further plate may be provided, which is connected to ground. The plasma can be ignited between the plates connected to the ignition capacitance and the plate connected to ground.

The resonant circuit may have a distributed resonant inductance and a distributed resonant capacitance. Such an arrangement allows ignition of a plasma without having to use additional auxiliary circuitry for igniting the plasma.

The resonant circuit may have a symmetrical configuration including two identical resonant capacitors, each forming one half of the resonant capacitance and two identical resonant coils, each forming one half of the resonant inductance. The resonant coils maybe coupled with an end of the coupling element each.

As mentioned above, two ignition capacitances may be provided, each being connected to a connection point between one of the resonant capacitors and one of the resonant coils, and each being connected to an ignition plate.

One of the resonant capacitors may be located at a cooling fluid inlet and one of the resonant capacitors may be located at a cooling fluid outlet of the cooling pipe. Thus it is possible to bring the potential of the cooling fluid inlet and cooling fluid outlet to a similar potential, in particular ground potential. This helps in reducing the requirements concerning cooling fluid contamination.

The cooling fluid inlet and the cooling fluid outlet may be arranged next to one another.

The cooling fluid inlet and the cooling fluid outlet may be at similar electrical potential, in particular, both may be at ground potential or at least very near to ground potential.

Thus, there are lower contamination requirements for the cooling fluid, hence there is no direct current component flowing in the cooling fluid which could cause electrolysis. This is also an advantage if the power supply is not fully symmetrical for example due to an asymmetrical active power factor correction circuitry (PFC) or due to asymmetrical mains (delta grounded). A symmetrical resonant circuit may also be advantageous.

According to a further aspect, the capacitance value of the resonant capacitance may be higher than the capacitance value of the ignition capacitance. Thus it can be ensured that the ignition capacitance has no or only very little effect on the plasma once the plasma has been ignited. By choosing the capacitance value of the ignition capacitance much lower than the capacitance value of the resonant capacitance it can typically be ensured that most of the resonant current flows via the resonant capacitances once the plasma has been ignited. A good value is to choose the capacitance value of the resonant capacitance at least ten times higher than the capacitance value of the ignition capacitance. In case of a plasma chamber with insulating walls and a ignition plate outside the plasma chamber the ignition plates are electrostatically coupled with the plasma, such that the ignition plates with the insulator wall can be considered a capacitor, which has a capacity value—practically very small—ca. 10 . . . 100 pF. The ignition capacitors may be designed with much larger capacity values than these in order not to drop off too much voltage. Capacitors in the range of 1 nF (2×2 nF in series) may be used. This is lower than the resonance capacitors which are in the range of 85 nF (2×170 nF in series), so the residual post-ignition current may be considered to be insignificant.

The excitation circuit may include a full-bridge oscillator. A full-bridge oscillator can be used for exciting the resonant circuit at different frequencies. In particular, the full-bridge oscillator can be used to create an RF signal (RE power) at the resonance frequency of the resonant circuit for igniting the plasma and after the plasma has been ignited, the full-bridge oscillator can produce an RF signal having a frequency different to the resonance frequency, in particular, higher than the resonance frequency. Furthermore, a full-bridge oscillator may be used for adjusting the RF power provided to the resonant circuit and thus to the plasma chamber.

If a symmetrical arrangement is used for the resonant circuit, in particular an arrangement which is symmetrical to a center plane to the resonant circuit, a full-bridge oscillator can be used, which is difficult to use if an asymmetrical resonant circuit configuration is used.

As mentioned above, it can be advantageous if the full-bridge oscillator is capable of providing RF power at different frequencies.

In one aspect, the excitation circuit may include a converter such as a bridge or full bridge inverter which has a fast frequency control and a fast voltage control. This means a buck or a boost converter is connected upstream of the converter. The control means monitors voltage and current of the primary side of the transformer. It recognizes out of the phase between current and voltage whether the plasma is ignited or not. It regulates the frequency very fast after recognition of ignition. Very fast in this content should mean within less than 10 μs or less than 20 cycles of the RF frequency. The control also regulates the DC link voltage at the capacitor upstream of the inverter. This can be done also fast but may not be as fast as the variation of the frequency. It may be done in the form of a ramp decreasing or increasing the DC voltage. This is described in more detail later, Another aspect relates to a method of generating and maintaining plasma for plasma processing using inductively coupled RF power with an apparatus or power supply mentioned above.

The method may include measuring voltage and current of the plasma power supply.

The method may include evaluating the phase difference out of the voltage and current measurement of the plasma power, The method may include detection of plasma ignition out of the phase difference between voltage and current.

The method may include continuously decreasing the frequency and raising the voltage of the plasma supply in order to ignite the plasma.

The method may include increasing the frequency rapidly in less than 20 μs more than 10% from 410 to 490 kHz i.e. after detection of ignition.

The above and still further features and advantages will become apparent upon consideration of the following detailed descriptions of specific embodiments, especially when taken in conjunction with the accompanying drawings.

Figure 1:
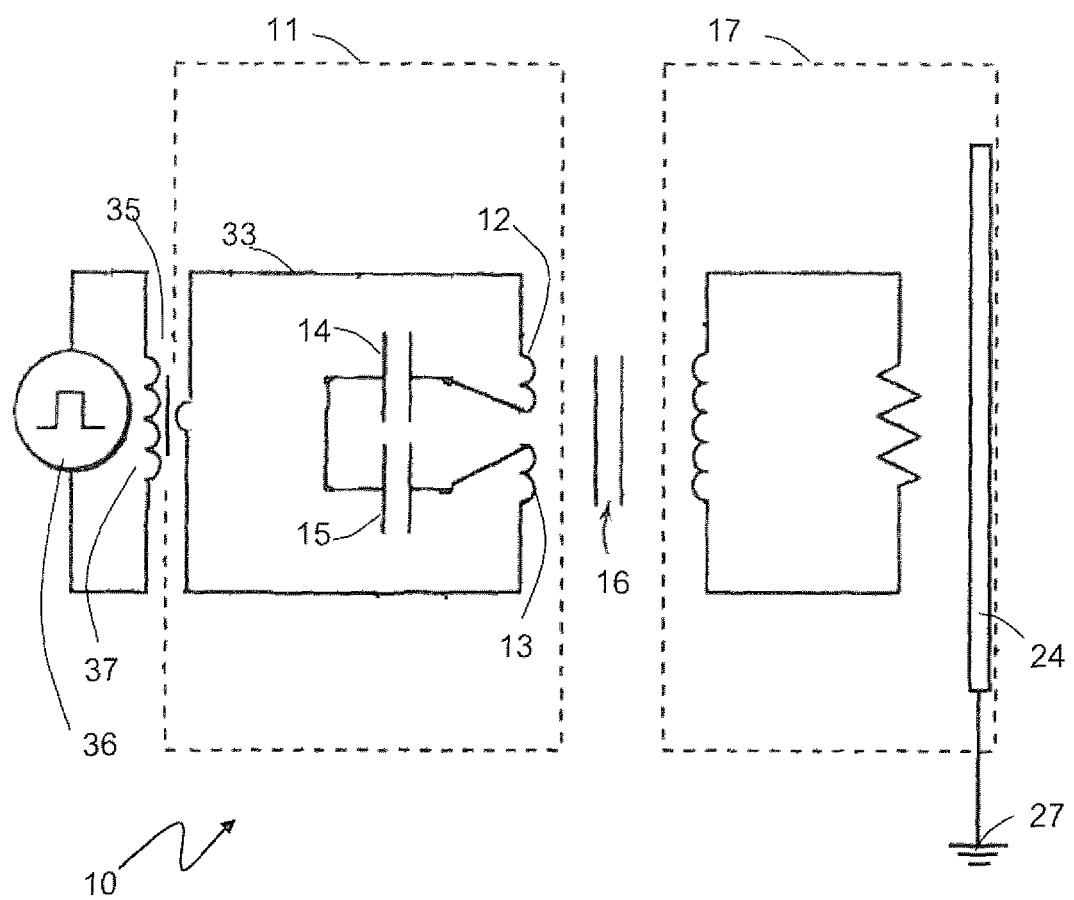
FIG. 1 is a schematic diagram of an embodiment.

FIG. 1 shows an apparatus 10 for generating and maintaining a plasma for plasma processing. The resonant circuit 11 includes a resonant inductance which may include two resonant coils 12, 13. Both coils can be identical. Both coils can each have a small number of turns (e.g., from one to five turns). Good results can be achieved with two turns for each coil. Good values for the inductance lay between 0.5 and 5 μH for each coil. Furthermore, the resonant circuit 11 includes a resonant capacitance, which may include two resonant capacitors 14, 15. As someone skilled in the art will understand, capacitors 14, 15 may each be realized by suitable configuration of several discrete capacitors. Good values for each capacitance lay between 30 and 300 nF. Very good results could be achieved with capacitance values between 100 and 200 nF for each capacitor.

The resonant coils 12, 13 are coupled with a coupling element 16, which is a ferrite element. The coupling element 16 extends into and through a plasma chamber 17. The coupling element 16 can be an open or a closed ring.

Figure 2:
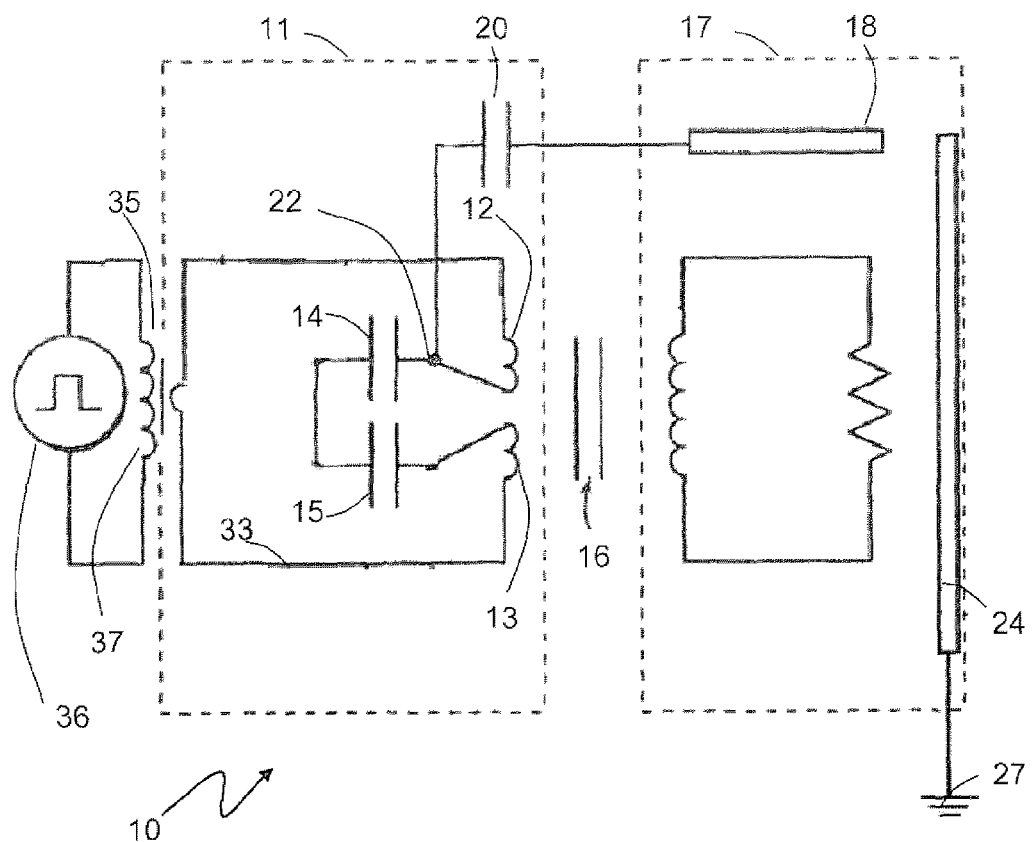
FIG. 2 is a schematic diagram of an embodiment with further additional features.

In FIG. 2 is shown a side plate 18 inside the plasma chamber 17 which is connected to an ignition capacitance 20. The ignition capacitance 20 is connected to connection point 22 between resonant coil 12 and resonant capacitor 14.

Figure 3:
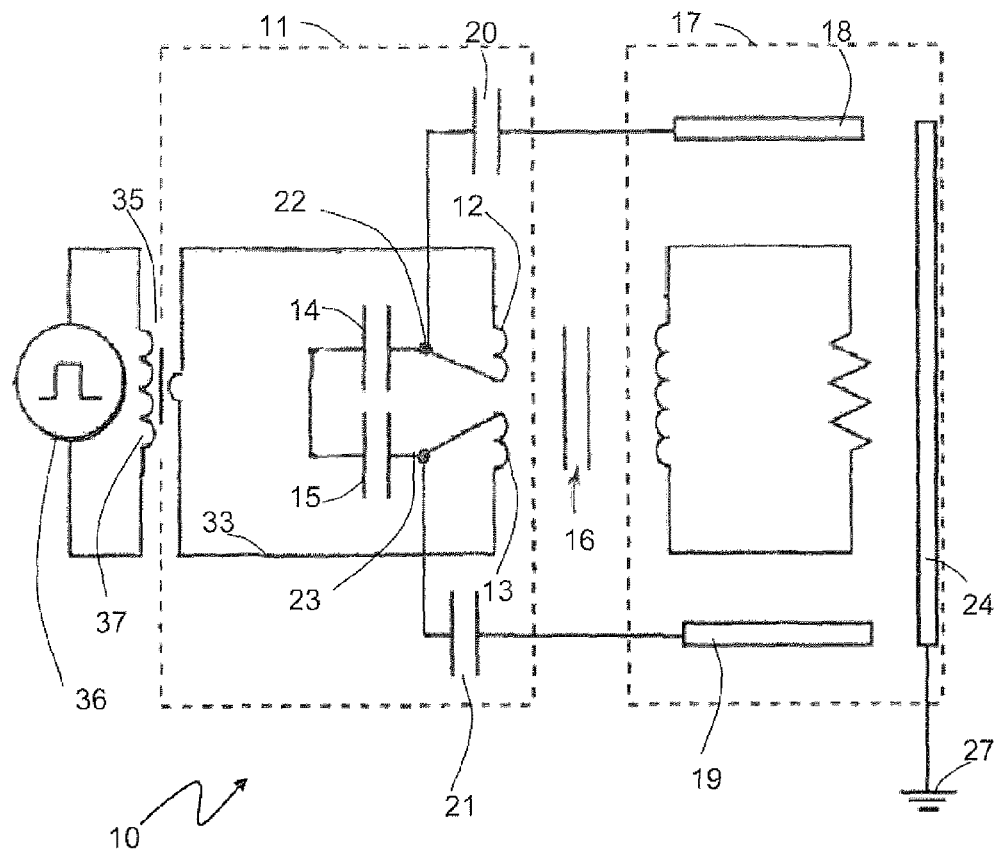
FIG. 3 is a schematic diagram of an embodiment with further additional features.

In FIG. 3 two side plates 18, 19 are provided, each connected to an ignition capacitance 20, 21. Ignition capacitance 21 is connected to connecting point 23 which is located between resonant capacitor 15 and resonant inductance 13.

In the plasma chamber 17, a further plate 24 is provided, which is connected to ground, indicated at 27.

The additional ignition capacities 20 and 21 can be chosen with low capacity. In particular ignition capacities 20 and 21 can be chosen with capacity values more than ten times lower than the resonance capacities. Very good values are between 1 and 5 nF for each of the ignition capacities 20 and 21, With such low capacity values, the elements are much more inexpensive than ignition circuits generally known in the art. They do not need to be cooled with cooling fluid. An additional advantage of such low capacity values is that the current through these capacities is limited, when the plasma is ignited, because the main current will flow through the resonant capacities with much higher capacity values.

Figure 4:
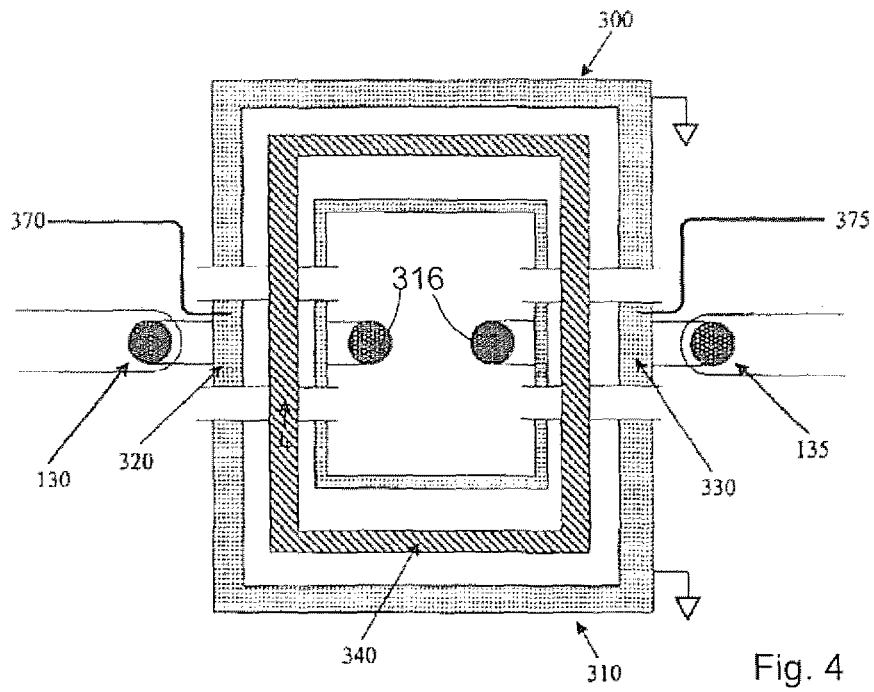
FIG. 4 shows an exemplary plasma source chamber configuration.
Figure 5:
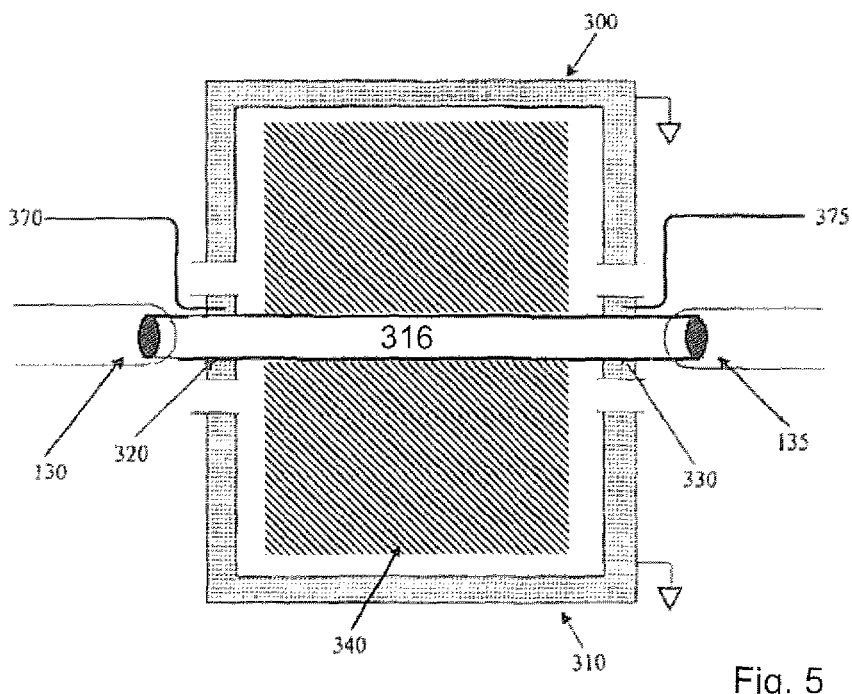
FIG. 5 shows an exemplary plasma source chamber configuration.
Figure 6:
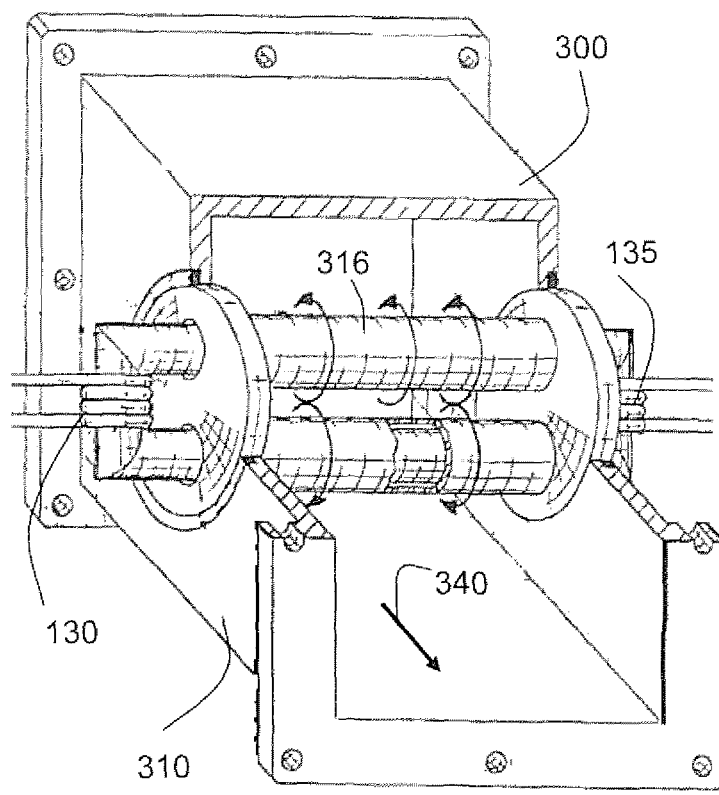
FIG. 6 shows an exemplary plasma source chamber configuration.
Figure 7:
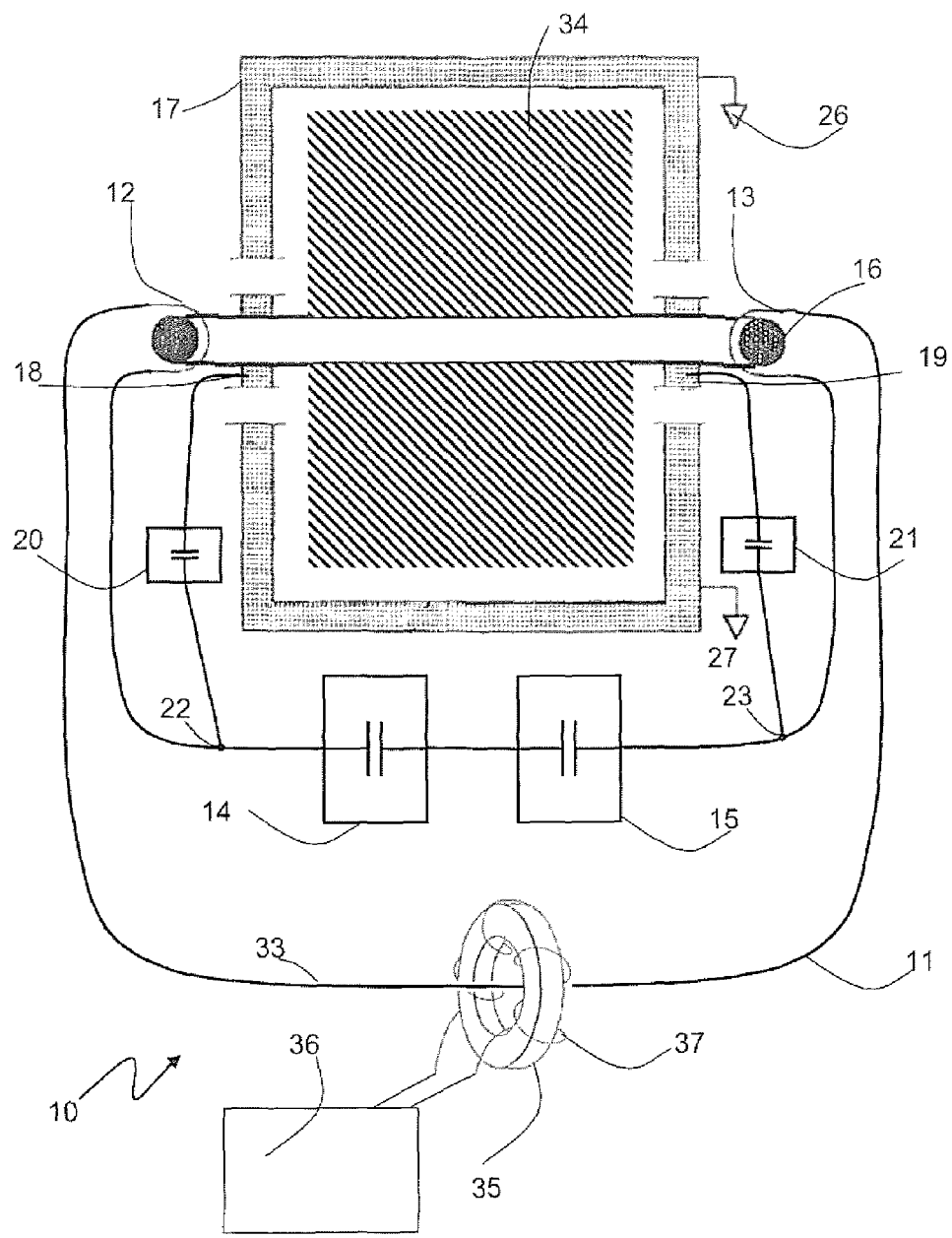
FIG. 7 is a combined drawing and schematic diagram of an embodiment.
Figure 8:
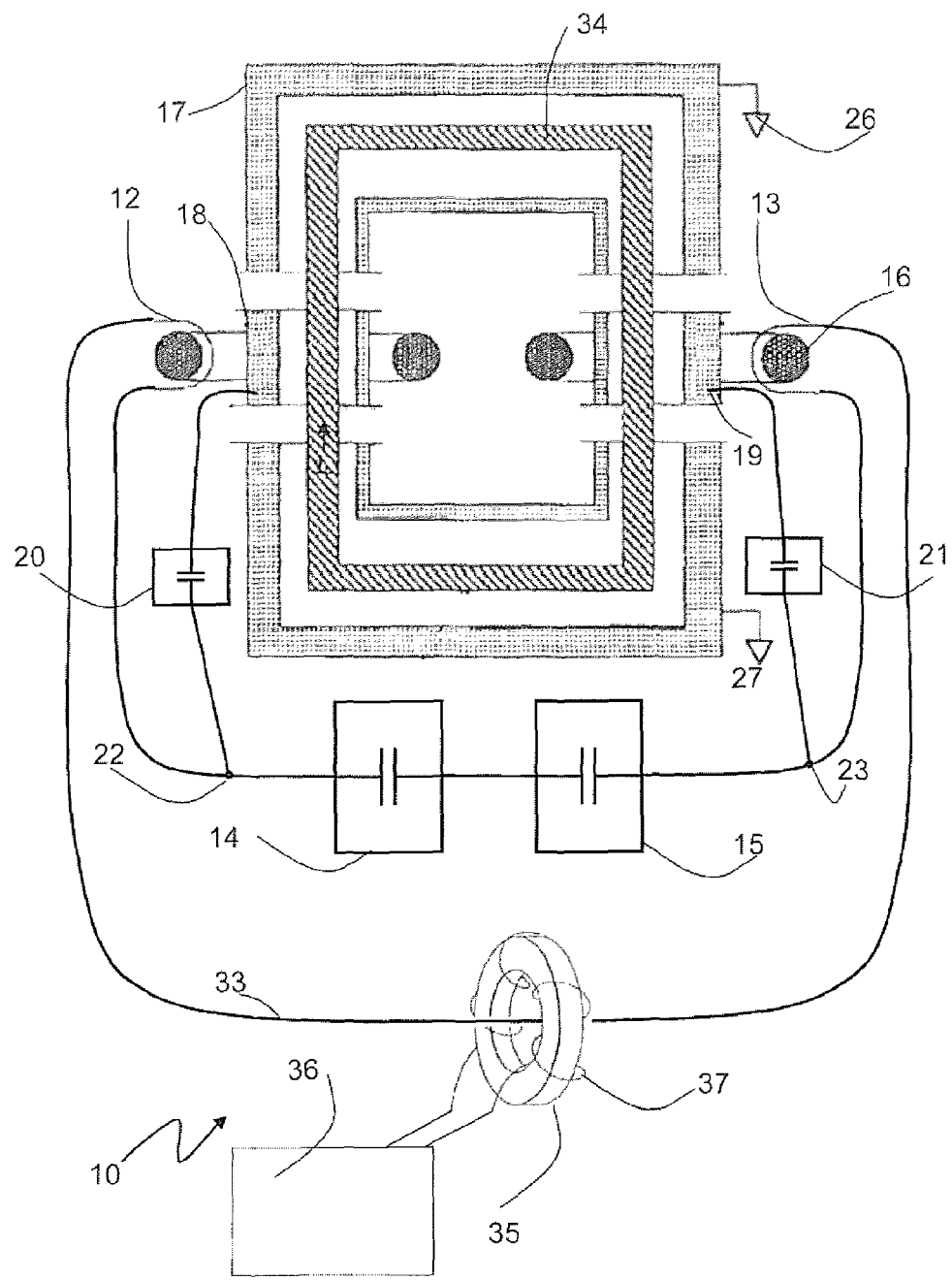
FIG. 8 is a combined drawing and schematic diagram of an embodiment.

FIGS. 4, 5 and 6 show exemplary plasma source chamber configurations. The chamber 300 includes four dielectric breaks, excitation transformers 130 and 135, and ignition inputs 370 and 375. Sections 300 and 310 of the plasma chamber are connected to ground. Sections 320 and 330, denominated ignition cores are electrically isolated from ground by the dielectric breaks.

According to one embodiment, the ignition inputs 370 and 375 are connected to ignition cores 320 and 330, respectively. According to another embodiment, the ignition inputs 370 and 375 can be connected to electrodes electrically isolated from the chamber. In FIG. 4 the plasma 340 flows in a plasma loop, which is established within the plasma chamber after the ignition circuit produces enough free charges to initiate the inductively coupled discharge. The magnetic cores 316 are fully outside the plasma. In FIGS. 5 and 6 the magnetic core is partially inside the plasma chamber and partially outside. The ignition inputs 370 and 375 receive a high voltage from an ignition circuit, which is in the prior art described as a complex circuit with additional windings on a transformer, FIG. 7 to FIG. 10 show how implementations described herein are provided to the plasma source chamber configurations of FIGS. 4 to 6.

In the plasma chamber 17, further plates 24, 25 are provided, which are connected to ground, indicated at 26, 27, The gas or after ignition the plasma gas 34 flows in the arrow direction in the plasma chamber 17.

Furthermore, the apparatus 10 includes an electrically conductive cooling pipe 30, having inlet 31 and outlet 32. In the embodiment, the resonant coils 12, 13 and a resonant circuit conductor 33 connecting the resonant coils 12, 13 are formed by the electrically conductive cooling pipe 30.

The resonant circuit conductor 33 also forms the secondary winding of a transformer 35. The transformer 35 is used to couple an excitation circuit 36 to the resonant circuit 11 in order to excite the resonant circuit 11. The primary winding 37 of the transformer 35 is coupled to a full-bridge oscillator 38. The full-bridge oscillator 38 includes four switching elements 39, 40, 41, 42. The switching elements 39, 40 are connected in series, forming a half bridge, and the switching elements 41, 42 are also connected in series, also forming a half bridge. The midpoints 43, 44 of the half bridges are connected to the primary winding 37.

Figure 9:
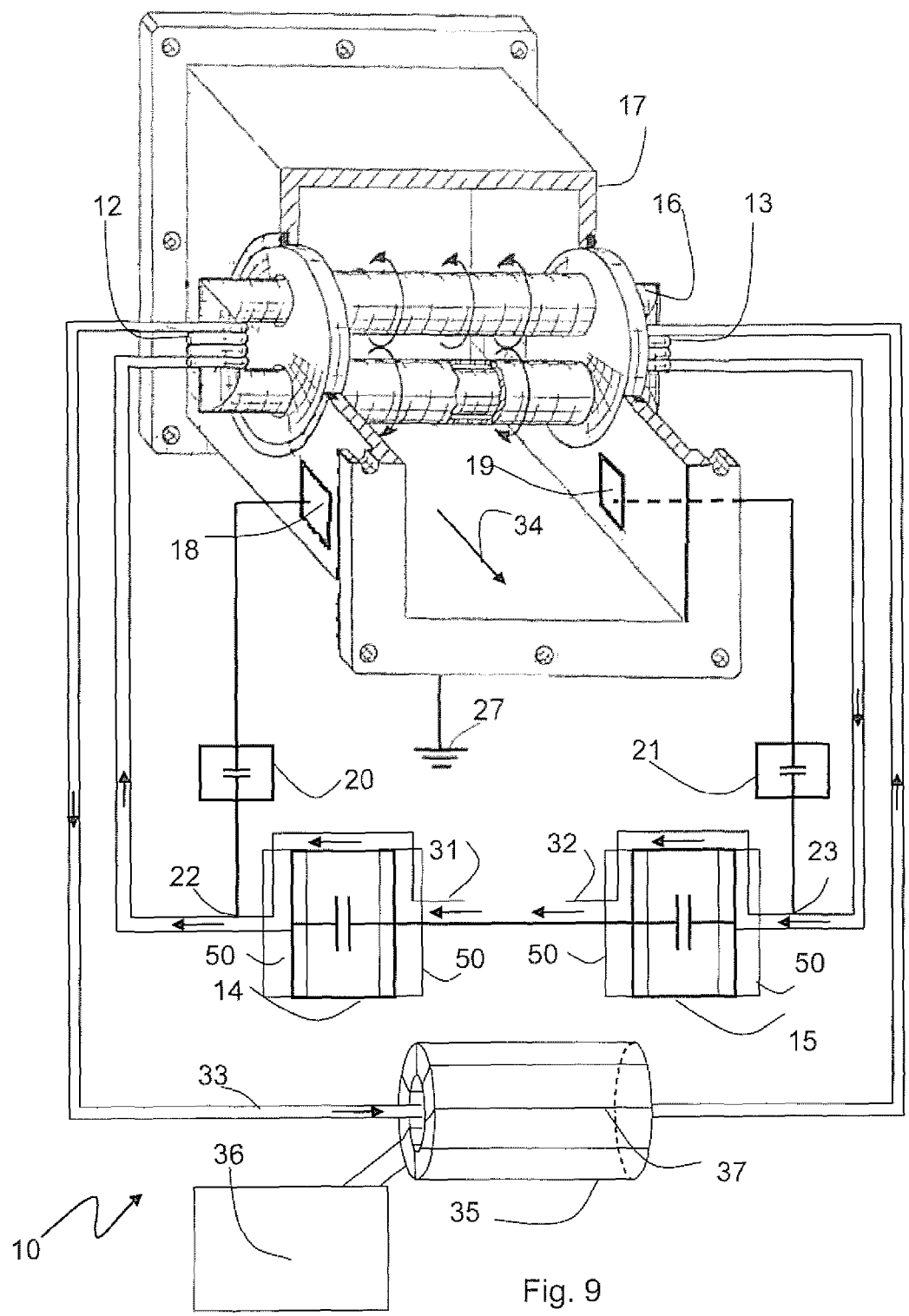
FIG. 9 is a combined drawing and schematic diagram of an embodiment.
Figure 10:
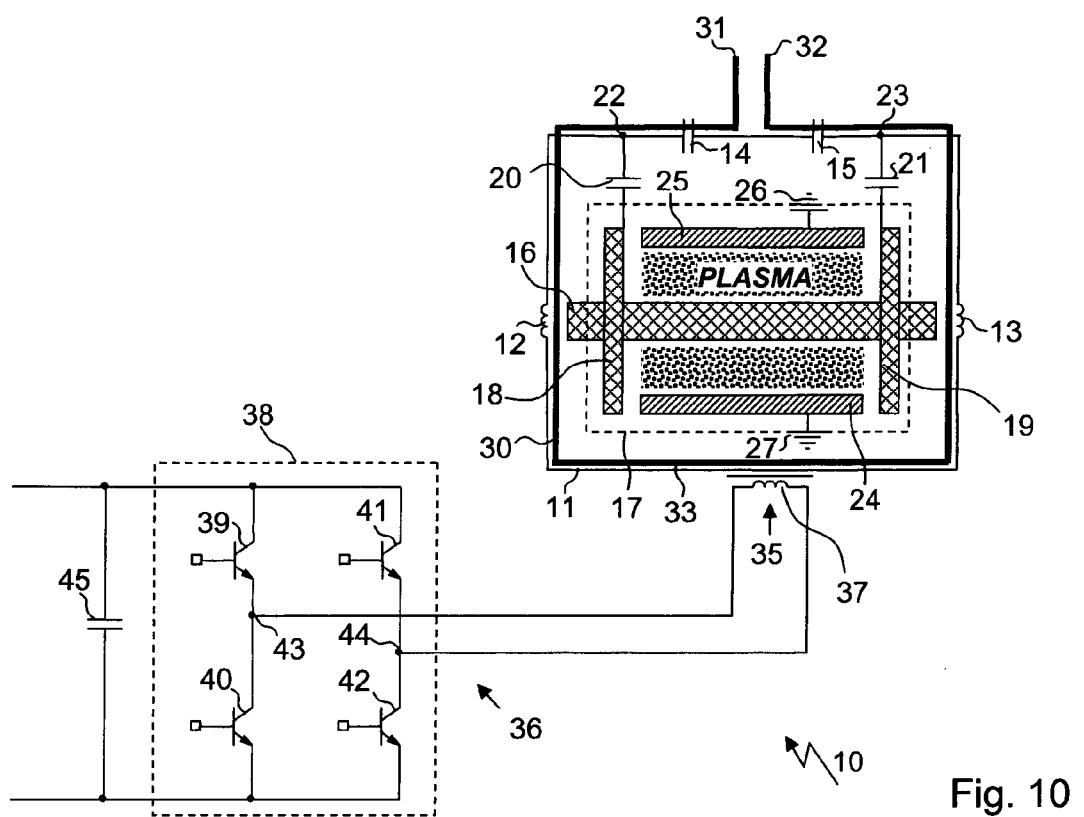
FIG. 10 is a combined drawing and schematic diagram of an embodiment.

The transformer 35 may be of the geometry of a toroidal transformer. The secondary 'winding' may be only a single straight conductor. This conductor may also be a tube out of metal preferably copper, with cooling fluid in it. The transformer can be built with the primary and secondary winding in proximity, so that the primary may also be cooled with the secondary 'winding'. The length of the transformer in direction to the secondary 'winding' may be longer than the width as shown in FIG. 9. The transformer can comprise a number of three to ten ferrite rings formed to a tube like arrangement. A capacitive coupling between primary and secondary winding which might be a disadvantage in other arrangements can be accepted in this special symmetric arrangement, due at least in part to the compensation by the resonant circuit and its nearly symmetric construction.

A voltage is provided for the full-bridge oscillator 38 by a voltage control 45, which in this case is represented by a capacitor.

In order to ignite a plasma within the plasma chamber 17, the plasma chamber 17 is evacuated and a plasma gas is supplied to the plasma chamber 17. The full-bridge oscillator 38 is operated to supply RF power at a certain frequency, in particular, at the resonance frequency of the series resonant circuit 11. The RF power is coupled to the resonant circuit 11 and thus the resonant circuit 11 is exited. If the resonant circuit 11 is operated close to or at its resonance frequency, a high voltage is present over resonant capacitors 14, 15. This high voltage is coupled to the plates 18, 19 via the ignition capacitances 20, 21, thus applying a large voltage between the plates 18, 19. This voltage causes the plasma within the plasma chamber 17 to ignite. As soon as the plasma ignites, the plates 18, 19 are at similar potential because the plasma is electrically conductive. This leads to a high voltage being present over the ignition capacitances 20, 21, the capacitor 14 and capacitance 21 as well as capacitor 15 and capacitance 21 now being parallel or close to parallel (e.g., substantially parallel). As a consequence, a large resonant current flows via the capacitors 14, 15. The ignition capacitances 20, 21 only have a negligible effect on the plasma within the plasma chamber 17, Hence, no ignition circuit has to be deactivated after the plasma has been excited. Due to the resonant capacitors 14, 15 being provided close to the cooling fluid inlet 31 and cooling fluid outlet 32, the inlet 31 and the outlet 32 are at similar electrical potential. In particular, they are close to ground potential.

After the plasma has been ignited, the full-bridge oscillator 38 may be operated to provide an RF power signal at a frequency that differs from the resonance frequency of the resonant circuit 11. In particular, the frequency may be higher than the resonance frequency, From the description of the apparatus 10 it is clear that the resonant circuit 11 has a symmetrical configuration, wherein the coils 12, 13 each provide for one half of the resonant inductance and the capacitors 14, 15 each provide for one half of the resonant capacitance. Also, the inlet 31 and the outlet 32 as well as the capacitances 20, 21 are arranged symmetrical to a center plane of the configuration.

FIG. 9 shows an at least partly perspective representation of the apparatus 10. Like reference numerals are used for elements that correspond to elements already described with reference to FIG. 1.

From FIG. 9 it is clear that the coil 12 has four turns, which are provided around one end of the coupling element 16. A similar configuration is provided on the opposite side of the plasma chamber 17, which cannot be seen in FIG. 9. Good results had been achieved with two turns on each end and with an open ferrite core.

The resonant capacitors 14, 15 are provided on a cooling plate 50. Cooling fluid may be passing through the cooling plate 50. From FIG. 9, it is can be derived that the resonant circuit 11 may be provided on one side of the plasma chamber 17. Thus, a very compact arrangement having a few components can be realized.

Excitation circuit 36 may be installed remote from the resonant circuit 11 and plasma chamber 17, The transformer should be placed in short proximity to the plasma chamber in order to keep the losses low.

Excitation circuit 36 may be installed also in close proximity to the resonant circuit 11 and plasma chamber 17. This will keep the losses even lower.

The resonant capacitors 14, 15 and the ignition capacitances 20, 21 are rated for high voltage over 1000 Vrms.

The resonant coils 12, 13 must withstand currents higher than 200 A both.

In some embodiments, the transformer has one turn on the secondary and six to ten turns on the primary winding. So currents on the primary are much lower than on the secondary.

The excitation circuit operates between 150 and 600 kHz. Voltage and frequency is fully controllable by a control.

In FIGS. 11 to 16 are shown diagrams which explain the method of control. All diagrams are divided in an upper part with a time scale of 400 µs and a lower part with a zoom view, which has a time scale of 2 µs. The rectangular waveform is the voltage and the more sine like wave form is the current on the primary side of the transformer. The measurement equipment calculates and shows the measured frequency. The upper part of the diagrams in FIGS. 11 to 16 are the same except for the position of the time line 11. In the upper part of the diagram a timeline 111 is shown in every one of FIGS. 11 to 16. It shows the time interval in which the zoom in the lower diagram is positioned in the upper diagram. So the six diagrams are subsequently distinctive intervals of interest.

Figure 11:
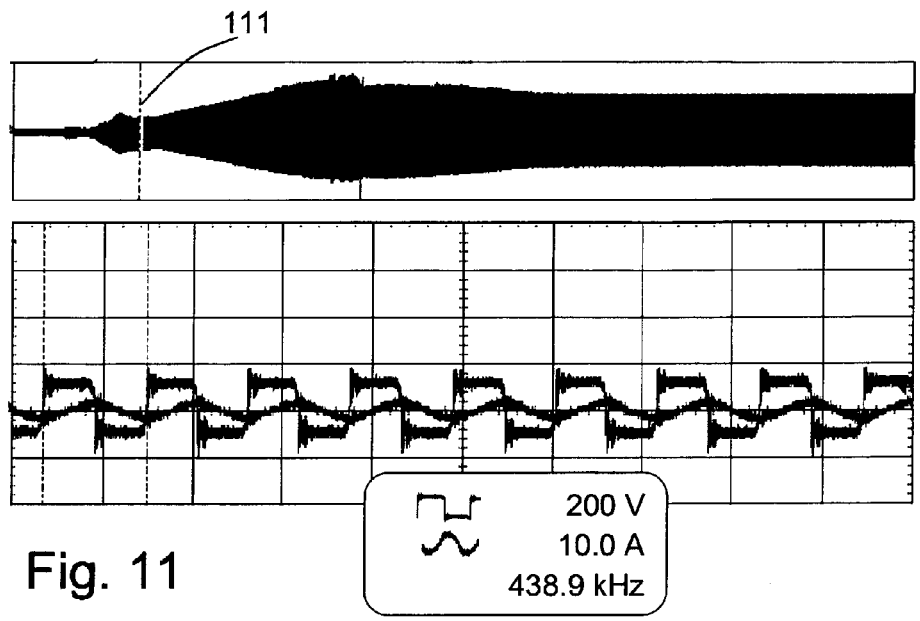
FIGS. 11 to 16 show diagrams of the ignition process.

FIG. 11 shows a start time interval with about 440 kHz and about 100V. Plasma is not ignited yet.

Figure 12:
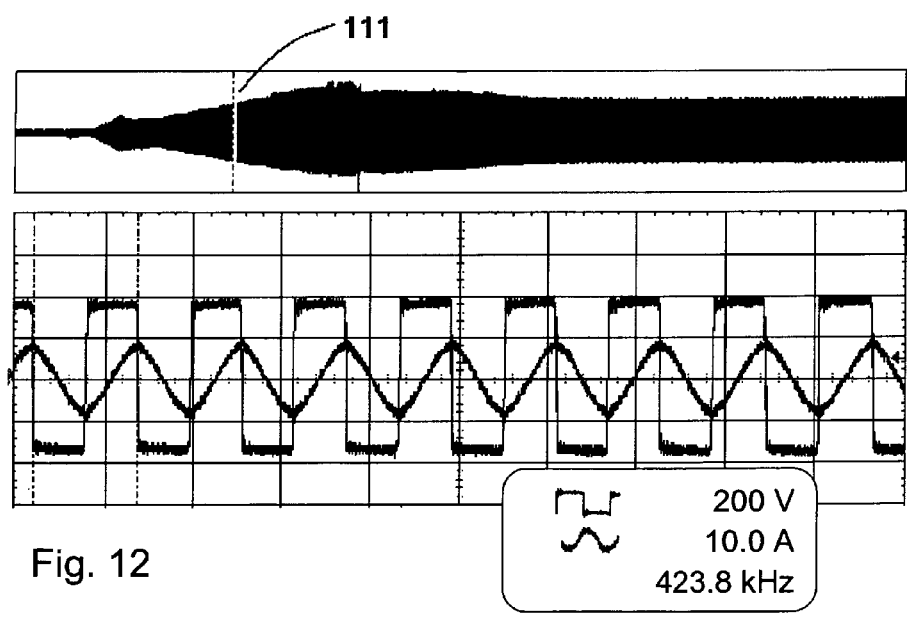
Figure 13:
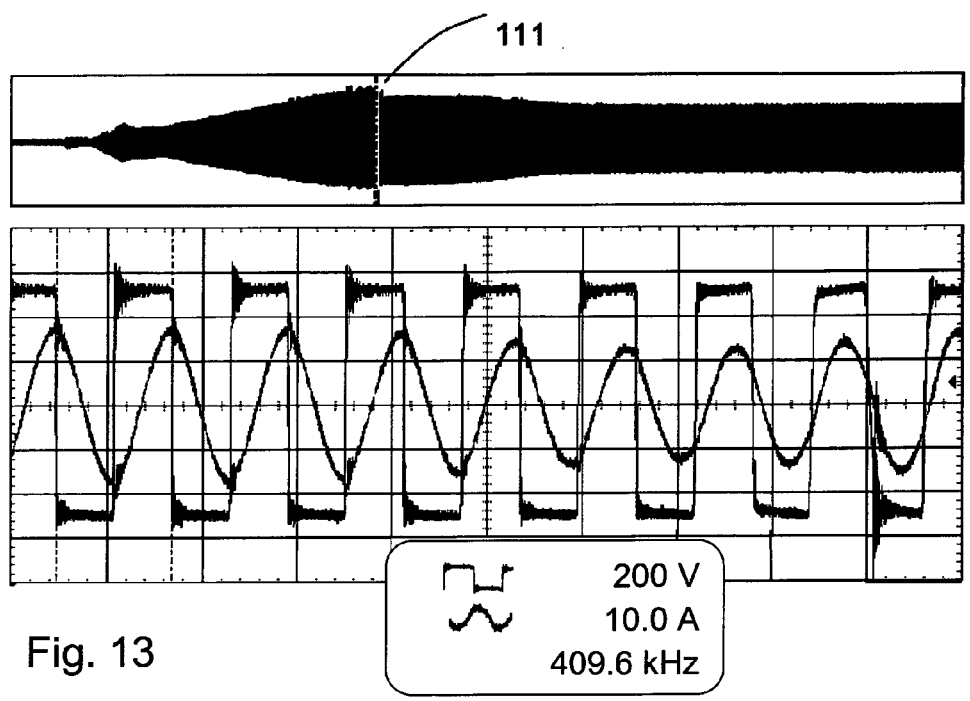

FIG. 12 shows a time interval some µs later. Voltage increased slightly to about 400V and frequency decreased slowly to about 420 kHz. Plasma is still not ignited yet FIG. 13 shows a time interval some µs later. Voltage has further increased to now 500V and frequency decreased slowly to about 410 kHz. Plasma is still not ignited yet.

Figure 14:
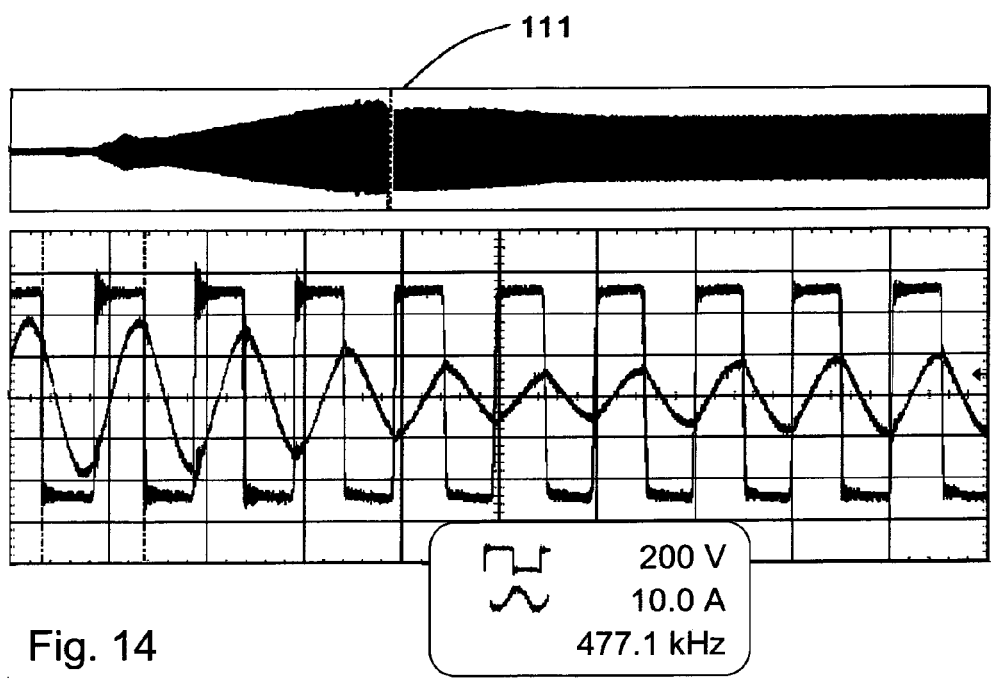

FIG. 14 shows a time interval only few µs later. Plasma has now ignited. Voltage has not changed significant but frequency has increased rapidly to about 480 kHz.

Figure 15:
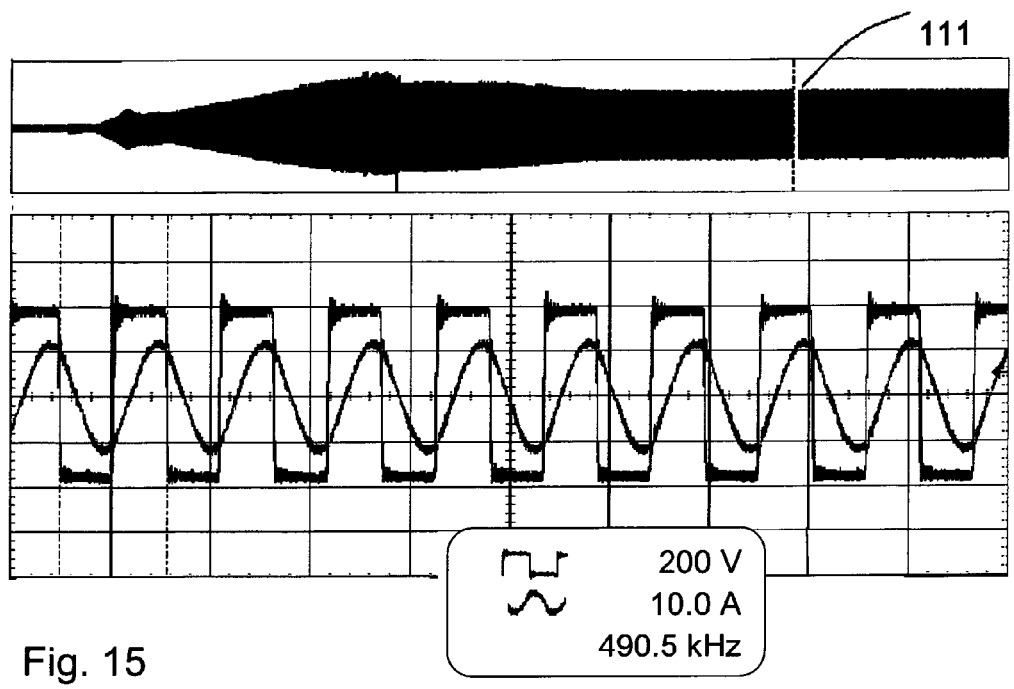

FIG. 15 shows a time interval only few has later. Plasma is still ignited. Voltage has not changed significantly but frequency has increased rapidly to about 490 kHz.

Figure 16:
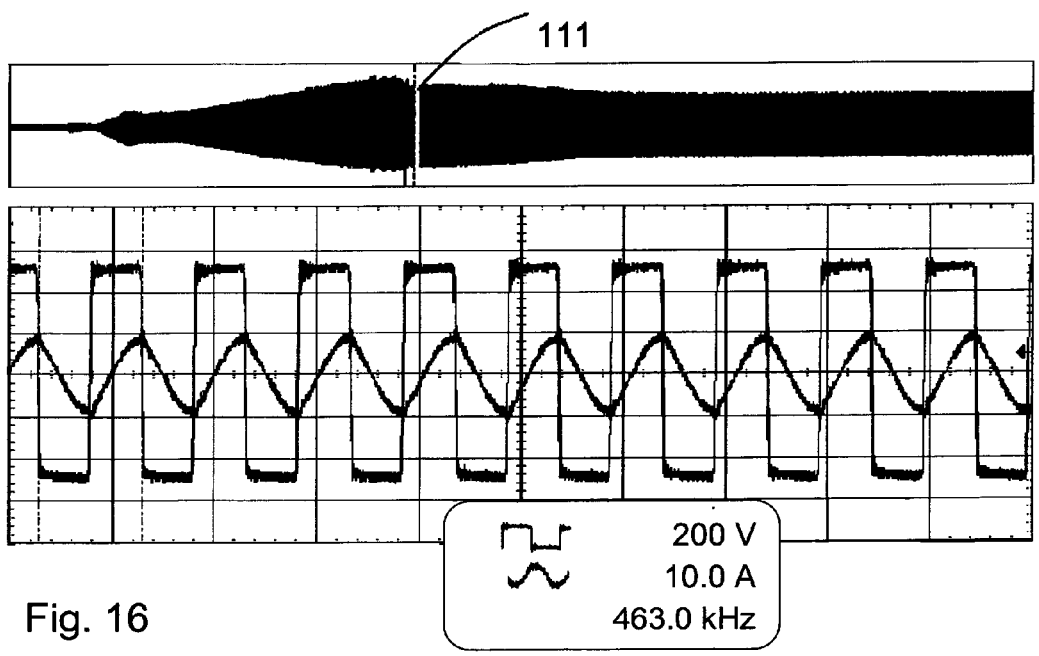

FIG. 16 shows a time interval some hundreds of µs later. Plasma is still ignited. Voltage has now decreased and frequency has also decreased to about 460 kHz.

In this way, the resonant circuit described above can be controlled in a stable way.

What is claimed is:

1. An apparatus comprising:
a resonant circuit comprising a resonant capacitance and a resonant inductance;
an excitation circuit configured to excite the resonant circuit; and
a coupling element configured to inductively couple RF power from the resonant inductance into a plasma chamber,
wherein the apparatus is configured to generate and maintain plasma in the plasma chamber for plasma processing using the inductively coupled RF power, and
wherein the resonant circuit has a symmetrical configuration comprising two identical resonant capacitors, each forming one half of the resonant capacitance, and two identical resonant coils, each forming one half of the resonant inductance.

2. The apparatus of claim 1, further comprising a transformer configured to couple the excitation circuit with the resonant circuit.

3. The apparatus of claim 2, wherein a primary winding of the transformer is part of the excitation circuit, and a secondary winding of the transformer is part of the resonant circuit.

4. The apparatus of claim 3, wherein the resonant circuit comprises a resonant current conductor configured to form the secondary winding of the transformer.

5. The apparatus of claim 4, wherein the resonant inductance of the resonant circuit and at least a part of the resonant current conductor comprise electrically conductive cooling pipe.

6. The apparatus of claim 5, wherein the cooling pipe comprises a copper pipe.

7. The apparatus of claim 1, wherein the coupling element comprises a ferrite core element that extends into the plasma chamber and is coupled to the resonant inductance.

8. The apparatus of claim 1, wherein the plasma chamber includes at least one plate connected via an ignition capacitance to the resonant circuit.

9. The apparatus of claim 8, wherein a capacitance value of the resonant capacitance is larger than a capacitance value of the ignition capacitance.

10. The apparatus of claim 8, wherein the plasma chamber comprises at least a second plate connected to ground.

11. The apparatus of claim 1, wherein the resonant circuit comprises a distributed resonant inductance and a distributed resonant capacitance.

12. The apparatus of claim 1, further comprising two ignition capacitances, each of the ignition capacitances connected to a connection point between one of the resonant capacitors and one of the resonant coils and to a plate in the plasma chamber.

13. The apparatus of claim 1, wherein one of the resonant capacitors is located at a cooling fluid inlet of a cooling pipe and the other one of the resonant capacitors is located at a cooling fluid outlet of the cooling pipe.

14. The apparatus of claim 13, wherein the cooling fluid inlet and the cooling fluid outlet are arranged next to one another.

15. The apparatus of claim 13, wherein the cooling fluid inlet and the cooling fluid outlet are at similar electrical potential.

16. The apparatus of claim 1, wherein the excitation circuit comprises a full bridge oscillator.

17. The apparatus of claim 16, wherein the full bridge oscillator is configured to provide RF power at different frequencies.

18. A plasma power supply system for generating and maintaining plasma in a plasma chamber, comprising:
   a resonant circuit comprising a resonant inductance and a resonant capacitance; and
   an excitation circuit configured to excite the resonant circuit such that a voltage is present over the resonant capacitance, the voltage being coupled via an ignition capacitance to the plasma chamber for generating the plasma,
   wherein at least a part of the resonant inductance is configured to inductively couple RF power to the plasma chamber via a coupling element, and
   wherein the resonant circuit has a symmetrical configuration comprising two identical resonant capacitors, each forming one half of the resonant capacitance, and two identical resonant coils, each forming one half of the resonant inductance.

19. A plasma processing system comprising:
   a plasma chamber; and
   an apparatus configured to generate and maintain plasma in the plasma chamber, the apparatus comprising:
      a resonant circuit comprising a resonant capacitance and a resonant inductance;
      an excitation circuit configured to excite the resonant circuit; and
      a coupling element configured to inductively couple RF power from the resonant inductance into the plasma chamber,
   wherein the resonant circuit has a symmetrical configuration comprising two identical resonant capacitors, each forming one half of the resonant capacitance, and two identical resonant coils, each forming one half of the resonant inductance.

* * * * *